US005619137A

United States Patent [19]
Vig et al.

[11] Patent Number: 5,619,137
[45] Date of Patent: Apr. 8, 1997

[54] CHOPPED LOW POWER MAGNETIC-FIELD DETECTOR WITH HYSTERESIS MEMORY

[75] Inventors: Ravi Vig; Teri Tu, both of Bow; Paul W. Latham, II, Lee, all of N.H.

[73] Assignee: Allegro Microsystems, Inc.

[21] Appl. No.: 600,380

[22] Filed: Feb. 12, 1996

[51] Int. Cl.⁶ .................. G01R 33/06; G01R 33/07; G01R 33/025; H03K 3/38

[52] U.S. Cl. .................. 324/251; 324/207.12; 324/225; 327/511

[58] Field of Search ................. 324/251, 252, 324/207.2, 207.21, 207.12, 225; 338/23 R, 32 H; 327/511, 510

[56] References Cited

U.S. PATENT DOCUMENTS

| | | | |
|---|---|---|---|
| 3,197,880 | 8/1965 | Rice et al. | 33/204 |
| 3,816,766 | 6/1974 | Anselmo et al. | 308/278 |
| 4,163,326 | 8/1979 | Edwards et al. | 33/361 |
| 4,283,643 | 8/1981 | Levin | 307/309 |
| 4,443,716 | 4/1984 | Avery | 307/309 |
| 4,705,964 | 11/1987 | Higgs | 307/278 |
| 4,908,527 | 3/1990 | Van Antwerp | 307/309 |
| 5,241,270 | 8/1993 | Ng | 324/251 |
| 5,280,455 | 1/1994 | Kanaishi | 307/64 |
| 5,493,218 | 2/1996 | Hayashi et al. | 324/207.21 |

Primary Examiner—Sandra L. O'Shea
Assistant Examiner—Roger C. Phillips

[57] ABSTRACT

A low power magnetic-field detector, of the kind for detecting an ambient magnetic field that is greater than a predetermined field strength, is comprised of a Hail element, a transducer-voltage amplifier, and a zero-crossing comparator, all connected in tandem. A clock and switch are used to chop the energizing current to the Hall element. Alternatively, the amplifier and comparator are also chopped to further reduce power consumption. A clockable flip flop is synchronously enabled for an instant at the end of each period of energizing the Hall element. The comparator output signal is transferred to the flip flop Q output and held there during each period of not energizing the Hall element. A Positive-feedback hysteresis circuit adds a bias voltage to the amplified Hall voltage and is applied to the comparator input to effect comparator hysteresis with memory covering clock-period portions when the Hall element is not energized. The comparator is thus transformed into a Schmitt trigger circuit having hysteresis memory, making it possible to chop the Hall element to substantially reduce the detector power consumption without loosing the hysteresis feature.

3 Claims, 4 Drawing Sheets ns magnetic-field detector includes
a magnetic-field-to-voltage transducer, e.g. a Hall element or
CHOPPED LOW POWER MAGNETIC-FIELD DETECTOR WITH HYSTERESIS MEMORY

BACKGROUND

This invention relates to a magnetic-field detector including a magnetic-field-to-voltage transducer, such as a Hall element or magneto-resistor bridge, followed by a comparator for producing a high binary output signal when the ambient magnetic field exceeds a predetermined level; and more particularly pertains to a chopped low power magnetic-field detector having hysteresis memory.

Magnetic-field detectors for use as a compass, including a Hall element as the magnetic-field-to-voltage transducer, are described in the U.S. Pat. No. 3,197,880 issued Aug. 3, 1965 and in U.S. Pat. No. 4,163,326 issued Aug. 7, 1979. These detectors provide sinusoidal driving currents for energizing non-co-planar multiple Hall elements and produce an analog signal (that may be converted to a digital signal) indicating compass heading, but do not chop a Hall element on and off and have no need for a hysteresis feature. An electronic compass, employing a Hall elements array is described in the U.S. Pat. No. 5,241,270 issued Aug. 31, 1993, wherein the polarity of the summed outputs of Hall elements is determined by a largest voltage sensing circuit and that largest voltage is converted to digital form and held in a buffer that is connected to a digital display, indicating compass heading.

It is well known to make latching magnetic-article-proximity detectors comprising a Hall latch having a Hall element a Hall voltage amplifier, and a Schmitt trigger circuit or other latch with hysteresis for producing a binary output signal. Examples of such latches are described in the U.S. Pat. No. 3,816,766 issued Jun. 11, 1974 to Anselmo et al, U.S. Pat No. 4,443,716 issued Apr. 17, 1984 to G. Avery and U.S. Pat. No. 4,705,964 issued Nov. 10, 1987 to J. Higgs. These patents are assigned to the same assignee as is the present invention.

Such a latching magnetic-article-proximity detector having a temperature compensation feature is described in U.S. Pat. No. 4,908,527 issued Mar. 13, 1990 to J. C. Van Antwerp, wherein the Schmitt-trigger hysteresis function is achieved a zero-crossing comparator having a switched feedback circuit connected from the comparator output to input. The amount of feedback depends upon a pair of feedback resistor values and a current source that depends upon a reference resistor value. By making these three resistors of predetermined temperature coefficients, the operate and release points of the composite Schmitt trigger circuit are temperature compensated with respect to changes in magnet strength, Hall sensitivity and other parameters with temperature.

In the U.S. Pat. No. 4,283,643 issued Aug. 11, 1981 to H. P. Levin, there is described an electronic Hall sensor for generating a signal current having a fixed phase relationship with the current in a power distribution conductor. The energizing current in the Hall element is activated and deactivated in response to command signals in order to limit errors due to temperature drift attributed to the flow of Hall energizing current.

It is an object of this invention to provide a latching magnetic-field detector in which the Hall element is chopped to reduce the energy drawn from the power supply, there being no loss of hysteresis memory attributable to the chopped Hall-element energizing current being turned off for a high percentage of each chop cycle.

SUMMARY OF THE INVENTION

A low power-consuming magnetic-field detector includes a magnetic-field-to-voltage transducer, e.g. a Hall element or a magneto-resistor bridge. The transducer may be considered to include a transducer-voltage amplifier, or alternatively a seperate transducer-voltage amplifier may have an input connected to the output of the transducer. The detector further includes a zero-crossing comparator of the kind for producing a binary signal of one voltage level when the comparator input signal is of one polarity, and visa versa. Also included are a clockable flip flop having an input connected to the output of the comparator and a free running clock means connected to the transducer for chopping the energizing current to the transducer. The clock means is connected to the flip flop for enabling the flip flop to acquire and remember the comparator binary output signal at an instant at the end of each period of energizing the transducer.

A summer circuit means has an output connected to the input of the comparator and has a first input connected to the output of the amplifier. A positive-feedback means, connected from the flip flop output to the second input of the summer circuit, is for producing at the second summer-circuit input a predetermined bias voltage of the one polarity only when the remembered Comparator binary output signal is at the one voltage level. The summer circuit means is for producing a voltage sum of the transducer output voltage and the predetermined bias voltage, and for applying the voltage sum to the input of the comparator to transform the comparator into a Schmitt comparator having a hysteresis with memory covering clock-period portions when the Hall element is not energized.

A method for detecting a magnetic-field of greater than a predetermined field strength includes providing a magnetic-field-to-voltage transducer, providing a zero-crossing comparator having a binary output signal composed of one and another voltage levels corresponding respectively to a positive and a negative comparator input signal, and periodically clocking and enabling the transducer for only a first portion of each clock period.

Additionally the method steps include remembering, during the remaining portion of the each clock period, the binary voltage level of the comparator output signal existing for an interval in the first clock period portion, and then adding to the transducer output signal a positive predetermined bias voltage only when the remembered binary comparator output voltage level is the above-the one level to produce a sum signal. The sum signal is applied to the input of the comparator, whereby the remembered binary voltage level serves as an indication whether or not there exists an ambient magnetic field of magnitude greater than a predetermined field strength, the predetermined field strength being a fixed function of the bias voltage.

The chopping of the magnetic-field-to-voltage transducer, e.g. a Hall element, can effect a major reduction in the power consumption of and heat generation in a magnetic-field detector. This invention recognizes that, because the Signal from the transducer periodically dissapears, a chopped magnetic-field detector cannont include a standard Schmitt trigger circuit for providing a binary output signal in which one binary level corresponds to one range of magnetic fields and the other binary level corresponds to another, as known in the prior art without chopping. This invention provides a chopped magnetic-field detector having a comparator that includes a flip flop memory for serving as a new Schmitt trigger circuit with hysteresis memory, and this chopped-transducer detector achieves much lower power operation while providing good dynamic response to changing magnetic fields.

BRIEF DESCRIPTION OF THE DRAWINGS

FIGS. 2a through 2f are drawn to the same time scale.

DESCRIPTION OF THE PREFERRED EMBODIMENTS

Figure 1:
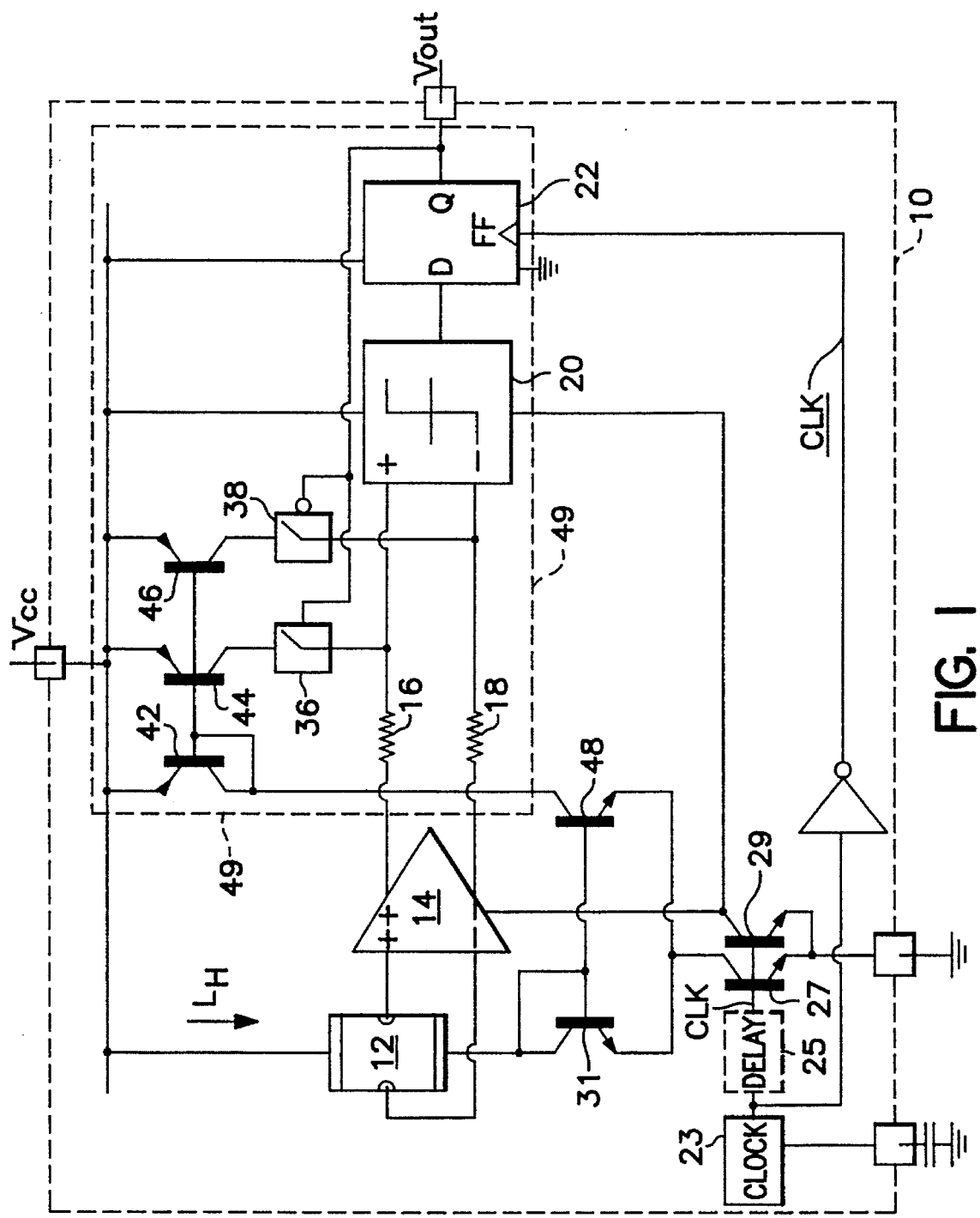
FIG. 1 shows a diagram of a first embodiment of an integrated-circuit magnetic-field detector of this invention.

In order to reduce the power consumption in the magnetic field detector of FIG. 1, the energizing current to the Hall element is chopped, it being well known that Hall elements in such detectors tend to consume a large amount of power.

The silicon integrated circuit chip 10 of FIG. 1 includes a Hall element 12 and a Hall voltage amplifier 14 with a differential output connected via two resistors 16 and 18 to the differential input of a zero-crossing comparator 20. When a positive polarity signal appears at the input of the comparator 20, the comparator binary output signal is high and visa versa. The comparator output is connected to the D input of the flip flop 22.

Figure 2A:
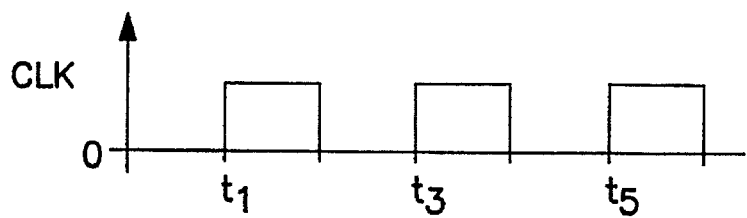
FIG. 2a shows a waveform of the binary clock signal (clk) in the detector of FIG. 1.
Figure 2B:
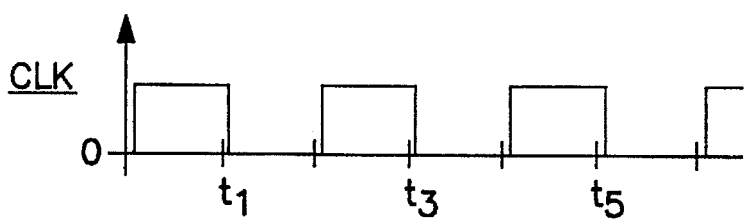
FIG. 2b shows a waveform of the binary complementary clock signal (clk) in the detector of FIG. 1.
Figure 2C:
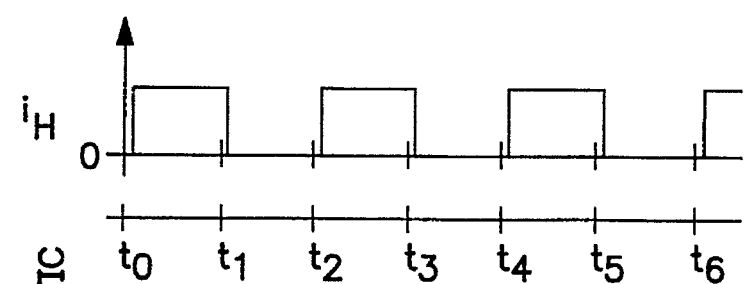
FIG. 2c shows a waveform of the chopped energizing current to the Hall element in the detector of FIG. 1.

An invertor is connected between the output of the clock 23 to the clock-input of flip flop 22. Thus there is presented at that flip-flop clock-input a complimentary (clk) signal to that at the output signal of the clock 23. A clock signal (clk) having a waveform as shown in FIG. 2a is produced at the output Of delay circuit 25. Thus each positive (or negative) half cycle of the clock signal (clk) is slightly delayed relative to the corresponding negative half cycle of the complimentary clock signal (clk), having a waveform as seen in FIG. 2b, by an amount equal to the delay effected by delay circuit 25.

The clock signal (clk) from the output of the delay circuit 25, when periodically high and low, turns on and off respectively the energizing current $i_H$ to the Hall element 12 via the NPN transistor switch 27 and diode 31. At the same time, the clock signal (clk) from the output of the delay circuit 25 simultaneously energizes and de-energizes the amplifier 24 and the comparator 20 via the NPN switch transistor 29.

Figure 2D:
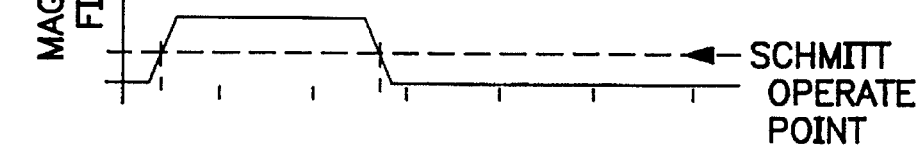
FIG. 2d shows a waveform of the ambient magnetic flux at the detector of FIG. 1.
Figure 2E:
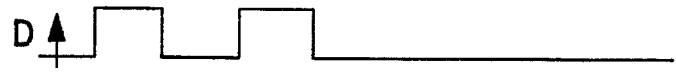
FIG. 2e shows a waveform of the binary input data signal to the input of the flip flop in the detector of FIG. 1.
Figure 2F:
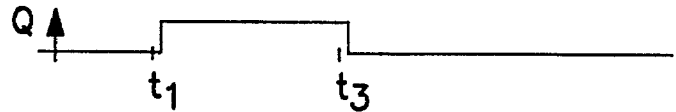
FIG. 2f shows a waveform of the Q output signal from the D flip flop, in response to the input data signal of FIG. 2e.

The standard edge-triggered D flip flop 22 produces a binary high output signal, as illustrated in FIG. 2f, at the Q output when simultaneously the D input signal as in FIG. 2e is high and the applied clock signal (clk) is high. This situation may only occur in the short time spans just after transitions from low to high in the complimentary clock signal (clk) at times $t_1$, $t_2$, $t_3$ etc.

For example, as illustrated by FIGS. 2d, 2e and 2f, when during the high half-clock period in the clock signal (clk) from $t_0$ to $t_1$ the ambient magnetic field is strong enough that the Hall voltage at the operate threshold of the comparator 20 is exceeded, then the comparator output signal is high in the above mentioned short time span after $t_1$.

This results in the flip flop 22 being set. And not until the clock half period from $t_2$ to $t_3$, during which the ambient magnetic field has dropped and consequently the Hall voltage at the input of comparator has fallen below the release threshold of the comparator 20, will the flip flop 22 experience a short time span (at $t_3$ in this example) in which the D input to the flip flop is low when the complementary clock signal (clk) becomes high.

The necessary short time spans after $t_1$, $t_2$, $t_3$ etc. during which high pulses in the clock signal (clk) and the complimentary clock signal (clk) are overlapping, may well occur without any delay being provided between the output of the clock and the base of transistor 27, because there will always be some delay in the amplifier 14 and in the comparator 20. In this case, delay circuit 25 may be omitted.

In other words, the flip flop output signal changes state only at a transition (at $t_1$) from low to high in the complimentary clock signal (clk) while a high signal has previously been established at the D input of the flip flop 22; the flip flop maintains a high Q output signal during the following cycle (e.g. from $t_1$ to $t_3$), and if at the transition (e.g. at $t_3$) from low to high in the complimentary clock signal (clk) the D input to the flip flop is still high then the Q output of the flip flop remains high for the following clock period (from $t_3$ to $t_5$). In short, at times $t_1$, $t_3$, $t_5$, etc., the flip flop 22 updates its memory of the state of the comparator output.

The Q output signal of the flip flop 22, which is also the output signal $V_{out}$ of the entire detector, is connected to the control inputs of a directly responding switch 36 and an inversely responding switch 38. A current mirror current source, composed of PNP transistors 42, 44, and 46, is capable of driving a current $I_{36}$ through closed switch 36 and from there through resistor 16 which develops a voltage drop across resistor 16 that becomes in effect the operate threshold of the comparator 20. Likewise, the current mirror current source is capable of driving a current $I_{36}$ through closed switch 38 and from there through resistor 18 which develops a voltage drop across resistor 18 that becomes in effect the release threshold of the comparator 20.

It will now be appreciated that the combination of the comparator 20, resistors 16 and 18, the current source made up of PNP transistors 42, 44 and 46, the switches 36 and 38, and the flip flop 22 performs as a Schmitt trigger circuit 49 with hysteresis memory. Since during those half clock periods when the clock signal (clk) is low, the Hall element having lost energizing current produces a Hall voltage of zero and the input to the comparator is also essentially zero while at the same time only the clock 23 and the flip flop 22 have not lost their energizing source. Thus without the memory embodied by the flip flop 22, there would be no hysteresis memory from one full clock period to the next, and chopping of the Hall element would render the detector circuit useless.

Another feature of the magnetic field detector circuit of FIG. 1 is that the current flowing through the Hall element, $i_H$, will vary as the resistance of the Hall-element body changes with temperature, and the transistor 48 combined with diode 31 is a current source that determines the currents that may flow through switches 36 and 38 and ultimately through resistors 16 and 18. When these resistors, namely Hall-element body and resistors 16 and 18 are made of the same material, e.g. epitaxial material in the integrated circuit, then the Hall voltage presented to the input of the comparator 20 is made more stable as a function of temperature.

In the description of the operation of the circuit of FIG. 1, the duty factor of chopping of the Hall element 12 and other circuit energizing currents is assumed to be 50% for clearest exposition. However, lower duty factors will be more effective in reducing the power consumption of the detector circuit up to the point wherein the width of the Hall energizing current pulses ($i_H$) begins to approach the settling time of the Hall-voltage amplifier 14 which will begin to degrade detection accuracy.

On the other hand, for high speed detection use, the amplifier and the comparator may be connected to be kept energized continuously (not chopped), obviating the settling time limitation.

Figure 3:
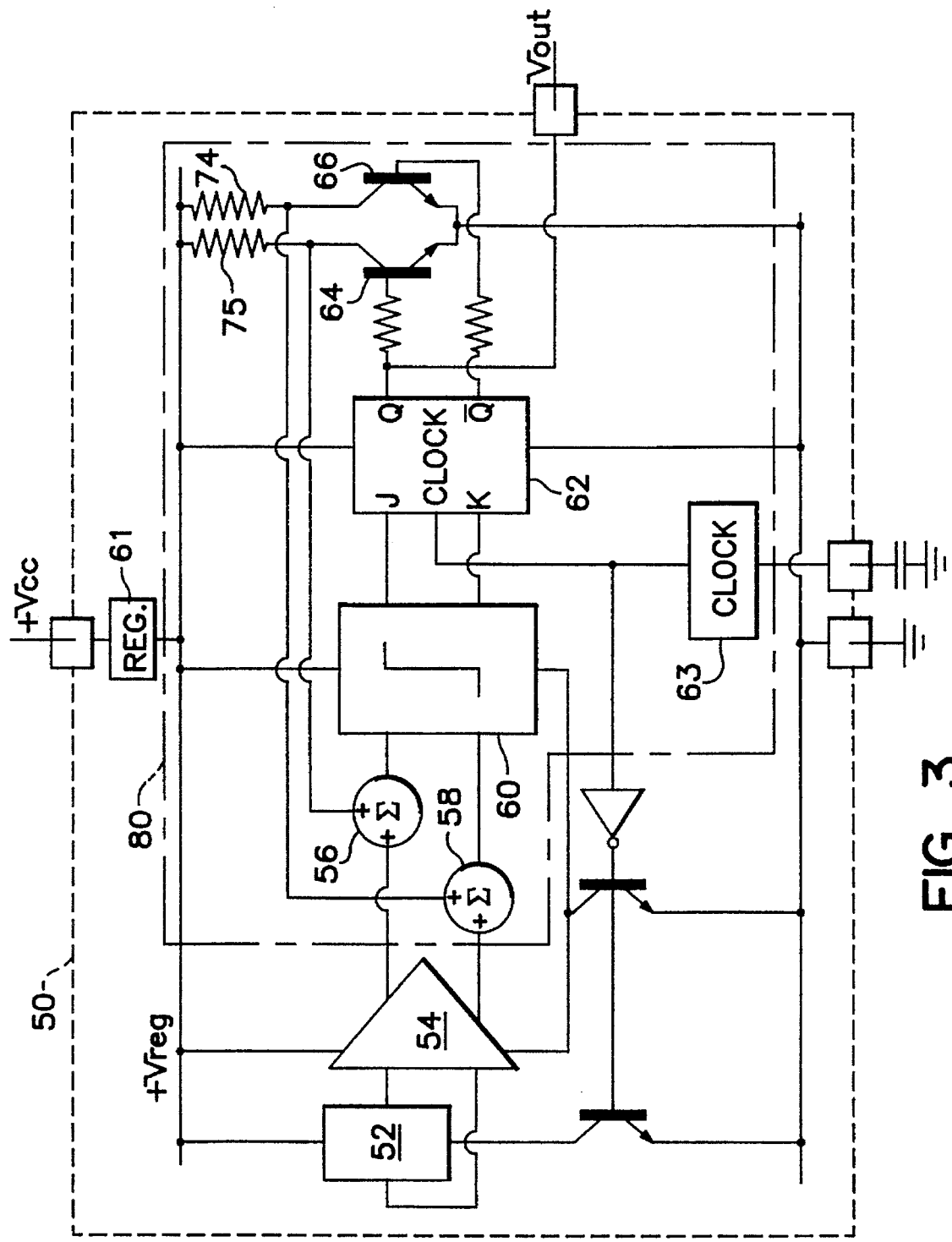
FIG. 3 shows a diagram of a second embodiment of an integrated-circuit magnetic-field detector of this invention.

The integrated magnetic-field detector 50 in FIG. 3 has a magnetic-field-to-voltage transducer 52 which may be a Hall element, a Hall element array, a magneto-resistor bridge etc. The transducer voltage is fed to the input of an amplifier 54 that is in turn connected via two summing circuits 56 and 58 to the input of a zero-crossing comparator 60 having differential input and output. The output provides a binary level to the J input of the clocked JK flip flop 62 and a complimentary binary level to the K input of the flip flop 62.

A voltage regulator 61 provides a regulated DC voltage $+V_{reg}$. A clock 63 is connected for chopping power to the transducer 52, amplifier 54 and the comparator 60, while the flip flop 62 is connected directly between ground and $V_{reg}$.

The Q and Q outputs of the flip flop 62 are connected respectively to the electrically-controllable current source comprised of transistor switches 64 and 66. The collectors of transistors 64 and 66 are connected respectively by resistors 74 and 75 to the source of DC voltage $+V_{reg}$, which collectors are also connected respectively to second inputs of the summing circuits 56 and 58. Thus when a transistor switch 64 or 66 is turned on, a low bias voltage is applied to the corresponding summing network; when a transistor switch 64 or 66 is turned off, a high bias voltage is applied to the corresponding summing network. These bias voltages are summed with the magnetic-field related voltages appearing at the outputs of the amplifier 54 and the sum is presented to an input of the comparator 60. All of the circuitry 80 following the amplifier 54 Comprises a clocked Schmitt trigger circuit comparator having hysteresis memory.

This clocked Schmitt trigger circuit 80 with hysteresis memory, may be combined with any synchronously clocked input signal, such as a clocked Hall voltage in the circuit of FIG. 1, making it possible for the first time to sample by chopping an analog signal and to provide a high (or low) binary output signal only when the sampled analog signal exceeds a predetermined magnitude.

As illustrated herein, this Schmitt trigger circuit with hysteresis memory makes it possible to chop at a low duty factor the otherwise dominant power-consuming magnetic-field-to-voltage transducer 52 and to substantially reduce the power consumption of the entire detector circuit.

Figure 4:
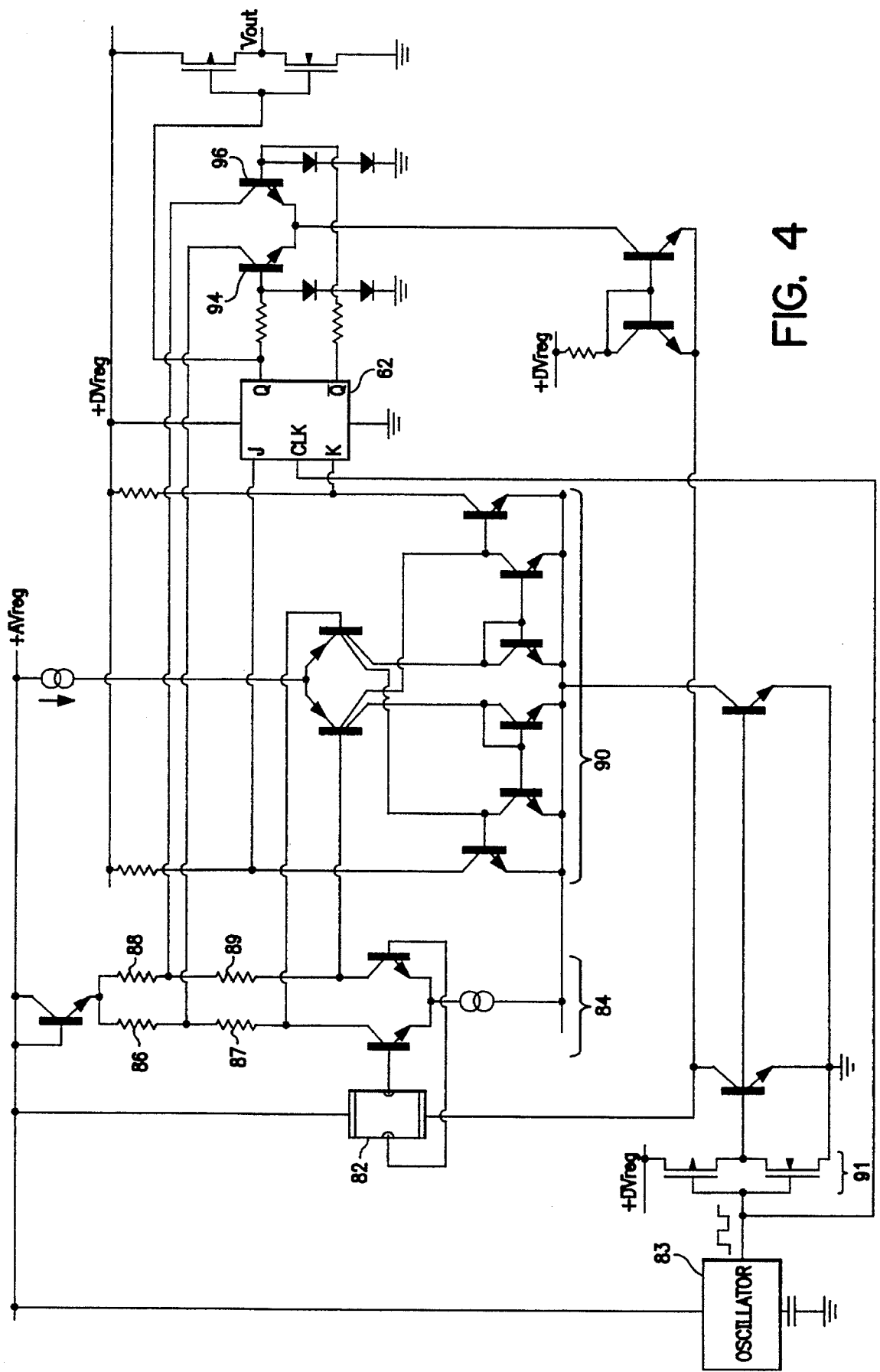
FIG. 4 shows a circuit diagram of a third embodiment of a magnetic-field detector of this invention.

The magnetic-field detector circuit of FIG. 4 has a Hall element 82, an amplifier 84, a zero-crossing comparator 90, a clocked JK flip flop 62, a pair of NPN transistor switches, and a CMOS invertor. The flip flop 62 and the oscillator (clock) are also preferably implemented by MOS circuitry to conserve space and reduce power consumption.

The resistors 86 and 88 in the collector circuits of the amplifier 84, have a circuit relationship with the NPN transistor switches 94 and 96 that is identical to that had by resistors 74 and 75 to NPN transistor switches 64 and 66 in FIG. 3. A summing circuit comprised of resistors 86 and 88 is merged in the collector circuits of differential amplifier 84 which additionally includes collector resistors 87 and 89. This merged summing circuit corresponds to the summing circuits 56 and 58 in FIG. 3, and has the same function of providing hysteresis memory feedback in the magnetic-field detector circuit of FIG. 4.

We claim:

1. A magnetic-field detector for detecting an ambient magnetic field that is greater than a predetermined field strength comprises:

a magnetic-field-to-voltage transducer;

a transducer-voltage amplifier having an input connected to said transducer;

a zero-crossing comparator of the kind for producing a binary signal of one voltage level when the comparator input signal is of one polarity;

a clockable flip flop having an input connected to the output of said comparator;

a free running clock means connected to said transducer for chopping the energizing current to said transducer, said clock means connected to said flip flop for enabling said flip flop to acquire and remember the comparator binary output signal at an instant at the end of each period of energizing said transducer; and a summer circuit means having an output connected to the input of said comparator, having a first input connected to the output of said amplifier, and having a second: input;

a positive-feedback means, connected from said flip flop output to said second input of said summer circuit, for producing at said second summer-circuit input a predetermined bias voltage of the one polarity only when the remembered comparator binary output signal is at the one voltage level, said summer circuit means being for producing a voltage sum of the amplified transducer voltage and the predetermined bias voltage, and for applying said voltage sum to the input of said comparator to transform said comparator into a Schmitt comparator having a hysteresis with memory to cover the clock-period portions when said Hall element is not energized.

2. A magnetic-field detector for detecting an ambient magnetic field that is greater than a predetermined field strength, comprising:

(a) a magnetic-field-to-voltage transducer;

(b) a transducer-voltage amplifier having an input connected to said transducer;

(c) a zero-crossing comparator having an input connected to the output of said amplifier for producing a binary output signal of one kind when the voltage at said comparator input is of one polarity and producing an output signal of the other kind when the voltage at said comparator input is of the other polarity;

(d) a free-running clock means connected to said transducer for producing a binary output clock signal alternating between one and another levels and for energizing said transducer when said clock signal is at the one level and de-energizing said transducer when the clock signal is at the another level;

(e) a clockable flip flop connected to said clock and having an input connected to the output of said zero-crossing comparator, for only at an instant, when the comparator output binary signal is of the one kind and when simultaneously the clock signal is changing from the one level to the another level, producing at said Q output a binary signal of one kind; and f) a positive-feedback hysteresis circuit means connected from the output of said flip flop back to said transducer-voltage amplifier for adding a bias to the amplifier output signal at said comparator input only when the output of said flip flop is the one kind, and transforming said zero-crossing comparator into a comparator having hysteresis with memory wherein the magnitude of said bias establishes said predetermined magnetic field strength above which detection of the field is effected.

3. A method for detecting a magnetic-field of greater than a predetermined field strength, comprising:

(a) providing a magnetic-field-to-voltage transducer;

(b) providing a zero-crossing comparator having a binary output signal composed of one and another voltage levels corresponding respectively to a positive and a negative comparator input signal;

(c) periodically clocking and enabling said transducer for only a first portion of each clock period;

(d) remembering, during the remaining portion of said each clock period, the binary voltage level of the comparator output signal existing for an interval in the first clock period portion;

(e) adding to the transducer output signal a positive predetermined bias voltage only when the remembered binary comparator output voltage level is the one level to produce a sum signal; and (f) applying the sum signal to the input of said comparator, whereby the remembered binary voltages level serves as an indication whether or not there exists an ambient magnetic field of magnitude greater than a predetermined field strength, said predetermined field strength being a fixed function of said bias voltage.

* * * * *